US012727368B2

(12) United States Patent
Wang et al.

(10) Patent No.: US 12,727,368 B2
(45) Date of Patent: Sep. 1, 2026

(54) DISPLAY PANEL, METHOD FOR MANUFACTURING SAME, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yanqiang Wang, Beijing (CN); Tao Gao, Beijing (CN); Yunhao Wang, Beijing (CN); Wei Xia, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 410 days.

(21) Appl. No.: 18/273,782

(22) PCT Filed: Jul. 29, 2022

(86) PCT No.: PCT/CN2022/109079
§ 371 (c)(1),
(2) Date: Jul. 24, 2023

(87) PCT Pub. No.: WO2024/021053
PCT Pub. Date: Feb. 1, 2024

(65) Prior Publication Data

US 2024/0407236 A1 Dec. 5, 2024

(51) Int. Cl.
*H10K 59/80* (2023.01)
*H10K 59/12* (2023.01)
*H10K 59/38* (2023.01)

(52) U.S. Cl.
CPC ....... *H10K 59/878* (2023.02); *H10K 59/1201* (2023.02); *H10K 59/38* (2023.02); *H10K 59/8792* (2023.02)

(58) Field of Classification Search
CPC .. H10K 59/878; H10K 59/1201; H10K 59/38; H10K 59/8792
See application file for complete search history.

(56) References Cited

U.S. PATENT DOCUMENTS

2014/0027724 A1* 1/2014 Lim ....................... H10K 59/38 257/40
2015/0001486 A1* 1/2015 Kim .................... H10K 59/122 438/23

(Continued)

FOREIGN PATENT DOCUMENTS

CN 105304827 A 2/2016
CN 111276526 A 6/2020

(Continued)

OTHER PUBLICATIONS

Notice of Reasons for Refusal of Japanese application No. 2024-541866 issued on Jul. 7, 2026, 87 pages.

*Primary Examiner* — Fatima N Farokhrooz
(74) *Attorney, Agent, or Firm* — XSENSUS LLP

(57) ABSTRACT

A display panel includes: a base substrate; a plurality of light-emitting units on the base substrate; a first light-transmitting layer on the base substrate provided with the plurality of light-emitting units; and a light-transmitting pattern on the base substrate provided with the first light-transmitting layer. The first light-transmitting layer includes a plurality of holes. An orthographic projection of a first light-emitting unit in the plurality of light-emitting units on the base substrate is overlapped with an orthographic projection of a first hole in the plurality of holes on the base substrate. The light-transmitting pattern includes a plurality (Continued)

of light-transmitting structures. A first light-transmitting structure in the plurality of light-transmitting structures covers the first hole and at least a portion of the first light-transmitting layer. A refractive index of a material of the light-transmitting pattern is greater than a refractive index of a material of the first light-transmitting layer.

17 Claims, 12 Drawing Sheets

(56) References Cited

U.S. PATENT DOCUMENTS

2015/0380466 A1 12/2015 Koo et al.
2019/0013496 A1 1/2019 Kim et al.
2020/0119113 A1* 4/2020 Lee ........................ H10K 50/11
2020/0144550 A1* 5/2020 Lee ...................... H10K 50/865
2020/0395574 A1* 12/2020 Lee ........................ H10K 59/38
2021/0210557 A1 7/2021 Lim et al.
2022/0157893 A1* 5/2022 Baek .................... H10K 59/873
2022/0199690 A1* 6/2022 Lee ........................ H10K 59/38
2023/0157062 A1 5/2023 Cai et al.
2025/0268084 A1* 8/2025 Yoo .................... H10K 59/8792

FOREIGN PATENT DOCUMENTS

CN 111613651 A 9/2020
CN 113050204 A 6/2021
CN 113394351 A 9/2021
CN 114068843 A 2/2022
CN 114220933 A 3/2022
CN 114447252 A 5/2022
CN 217035670 U 7/2022
JP 2004-310053 A 11/2004
JP 2012-225972 A 11/2012
JP 2016027374 A * 2/2016 ......... G02F 1/13394
JP 2019-008962 A 1/2019
JP 2019-114534 A 7/2019
JP 2022-040833 A 3/2022

* cited by examiner

DISPLAY PANEL, METHOD FOR MANUFACTURING SAME, AND DISPLAY DEVICE

CROSS-REFERENCE TO RELATED APPLICATION

The present disclosure is a U.S. national stage of international application No. PCT/CN2022/109079, filed on Jul. 29, 2022, the content of which is herein incorporated by reference in its entirety.

TECHNICAL FIELD

The present disclosure relates to the field of display technologies, and in particular, relates to a display panel, a method for manufacturing the same, and a display device.

BACKGROUND OF THE INVENTION

Display panels are components capable of displaying images.

SUMMARY OF THE INVENTION

Some embodiments of the present disclosure provide a display panel, a method for manufacturing the same, and a display device. The technical solutions are as follows.

According to one aspect of the embodiments of the present disclosure, a display panel is provided. The display panel includes:

a base substrate;

a plurality of light-emitting units disposed on the base substrate;

a first light-transmitting layer disposed on the base substrate provided with the plurality of light-emitting units, wherein the first light-transmitting layer includes a plurality of holes, and an orthographic projection of a first light-emitting unit in the plurality of light-emitting units on the base substrate is overlapped with an orthographic projection of a first hole in the plurality of holes on the base substrate; and a light-transmitting pattern disposed on the base substrate provided with the first light-transmitting layer, wherein the light-transmitting pattern includes a plurality of light-transmitting structures, a first light-transmitting structure in the plurality of light-transmitting structures covers the first hole and at least a portion of the first light-transmitting layer, and a refractive index of a material of the light-transmitting pattern is greater than a refractive index of a material of the first light-transmitting layer.

In some embodiments, the first light-transmitting structure includes a first portion covering the first light-transmitting layer and a second portion within the first hole, wherein a height, in a first direction perpendicular to and away from the base substrate, of the first portion is greater than a height, in the first direction, of the second portion.

In some embodiments, a top surface of the first portion of the first light-transmitting structure includes a curved surface projecting toward a direction away from the base substrate.

In some embodiments, a side surface of the first portion is a slope inclined toward a direction facing a center of the first hole, and an inclination angle of the side surface of the first portion is greater than or equal to 50 degrees.

In some embodiments, the inclination angle of the side surface of the first portion ranges from 70 degrees to 80 degrees.

In some embodiments, a wall of the first hole in the first light-transmitting layer is inclined toward a direction away from a center of the first hole, and an inclination angle of the wall is greater than a total reflection critical angle of an interface of the light-transmitting pattern and the first light-transmitting layer.

In some embodiments, the display panel further includes an effective display region and a peripheral region outside the effective display region, wherein the light-transmitting pattern is within the effective display region; and the display panel further includes:

a target pattern disposed on the base substrate provided with the light-emitting units, wherein the target pattern is within the peripheral region, and a refractive index of a material of the target pattern is greater than the refractive index of the material of the first light-transmitting layer.

In some embodiments, the target pattern and the light-transmitting pattern are disposed in a same layer.

In some embodiments, the target pattern includes at least one block structure group, wherein each of the at least one block structure group includes a plurality of block structures outside the effective display region and arranged along an edge of the effective display region.

In some embodiments, the target pattern includes at least two block structure groups, wherein the at least two block structure groups are successively arranged along a direction away from a center of the display panel.

In some embodiments, the target pattern includes a strip-shaped structure, wherein the strip-shaped structure is outside the effective display region and extending along an edge of the effective display region.

In some embodiments, the target pattern includes at least two strip-shaped structures, wherein the at least two strip-shaped structures are outside the effective display region and successively arranged along a direction away from a center of the display panel.

In some embodiments, a size of each of the block structures is identical to a size of the light-transmitting structure.

In some embodiments, the display panel further includes a first protrusion structure, wherein the first protrusion structure is within the hole in the first light-transmitting layer; and a portion, covering the first protrusion structure, of the first light-transmitting structure includes a second protrusion structure.

In some embodiments, a width of the strip-shaped structure ranges from 50 microns to 500 microns.

In some embodiments, the display panel further includes:

a barrier dam disposed at an edge of the base substrate, wherein an orthographic projection of the target pattern on the base substrate is disposed on a side, proximal to a center of the display panel, of an orthographic projection of the barrier dam on the base substrate.

In some embodiments, the display panel further includes:

a barrier dam disposed at an edge of the base substrate, wherein the target pattern covers the barrier dam.

In some embodiments, the light-transmitting structure is a color film layer; and the display panel further includes:

a black matrix pattern disposed on the base substrate provided with the light-transmitting pattern, wherein the black matrix pattern includes a cutout region, and an orthographic projection of the first hole in the first light-transmitting layer on the base substrate is within an orthographic projection of the cutout region on the base substrate.

In some embodiments, the first light-transmitting layer includes a first region covered by the first light-transmitting structure and a second region not covered by the first light-transmitting structure, wherein a thickness of a portion, within the first region, of the first light-transmitting layer is greater than a thickness of a portion, within the second region, of the first light-transmitting layer.

According to another aspect of the embodiments of the present disclosure, a method for manufacturing a display panel is provided. The method is applicable to manufacturing the display panel as described above. The method includes:

acquiring a base substrate;

forming a plurality of light-emitting units on the base substrate;

forming a first light-transmitting layer on the base substrate on which the plurality of light-emitting units are formed, wherein the first light-transmitting layer includes a plurality of holes, an orthographic projection of a first light-emitting unit in the plurality of light-emitting units on the base substrate is overlapped with an orthographic projection of a first hole in the plurality of holes on the base substrate;

forming a light-transmitting material layer on the base substrate on which the first light-transmitting layer is formed, wherein a refractive index of a material of the light-transmitting material layer is greater than a refractive index of a material of the first light-transmitting layer; and acquiring a light-transmitting pattern by processing the light-transmitting material layer by a patterning process, wherein the light-transmitting pattern includes a plurality of light-transmitting structures, a first light-transmitting structure in the plurality of light-transmitting structures covering the first hole and at least a portion of the first light-transmitting layer.

According to another aspect of the embodiments of the present disclosure, a display device is provided. The display device includes the display panel as described above.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

Definite embodiments of the present disclosure illustrated by the above accompanying drawings will be described in further detail hereinafter. These accompanying drawings and textual descriptions are not intended to limit the scope of the concept of the present disclosure in any form, but rather to illustrate the concept of the present disclosure for those skilled in the art by reference to particular embodiments.

DETAILED DESCRIPTION

The present disclosure is described in further detail with reference to the accompanying drawings, to clearly present the objects, technical solutions, and advantages of the present disclosure.

A typical display panel includes a base substrate, a plurality of light-emitting units disposed on the base substrate, and a first light-transmitting layer and a second light-transmitting layer that are disposed above the plurality of light-emitting units. The first light-transmitting layer includes a hole that is opposite to the light-emitting unit. The second light-transmitting layer is formed by an ink-jet process. The second light-transmitting layer fills the hole in the first light-transmitting layer, and thus a lens-like structure is formed at the hole, such that the light-exit efficiency of the display panel is enhanced.

However, the bendability of the above display panel is poor.

Figure 1:
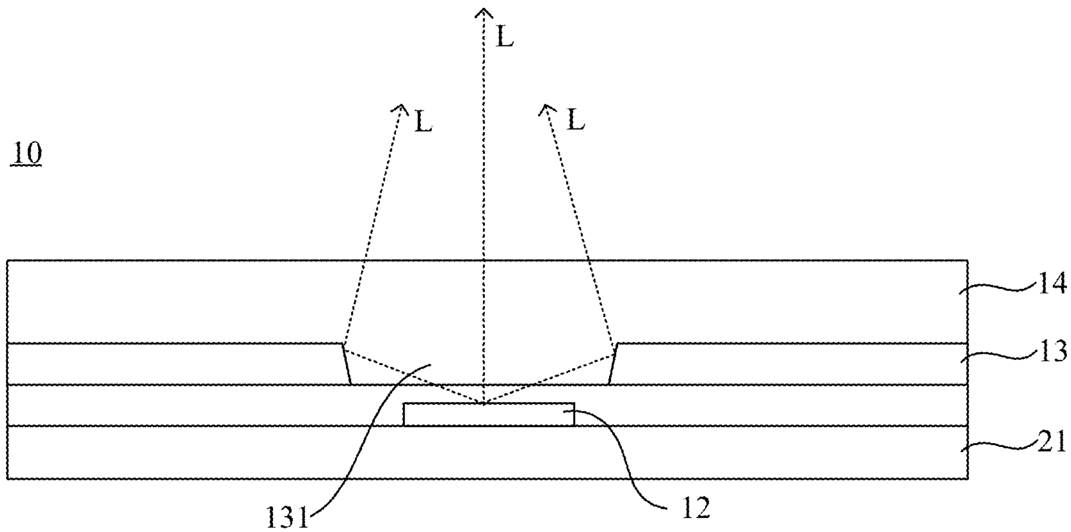
FIG. 1 is a schematic structural diagram of a display panel.

FIG. 1 is a schematic structural diagram of a display panel. Referring to FIG. 1, the display panel 10 includes a base substrate 11, a plurality of light-emitting units (only one light-emitting unit is illustrated in FIG. 1 as an example for descriptions) 12 disposed on the base substrate 11, and a first light-transmitting layer 13 and a second light-transmitting layer 14 that are disposed on the base substrate that is provided with the plurality of light-emitting units 12.

The light-emitting unit 12 includes an organic light-emitting diode (OLED). The display panel 10 includes light-emitting units configured to emit various colors of light, such as including a red light-emitting unit configured to emit red light, a blue light-emitting unit configured to emit blue light, and a green light-emitting unit configured to emit green light. The display panel is capable of displaying images by the light-emitting units that emit various colors of light. Upon activation of the display panel 10, the light-emitting unit 12 emits light L, which is exited from the display panel 10, such that a function of displaying images is implemented.

The first light-transmitting layer 13 includes a hole 131 facing the light-emitting unit 12, and the second light-transmitting layer 14 covers the first light-transmitting layer and fills the hole 131. A refractive index of a material of the first light-transmitting layer 13 is smaller than a refractive index of a material of the second light-transmitting layer 14. A lens-like structure is formed by cooperation between the hole 131 of the first light-transmitting layer 13 and the second light-transmitting layer 14. The light beam emitted by the light-emitting unit changes a direction under the control of this structure, such that the light beam irradiated to a visible range a is increased, and thus the light-exit efficiency of the display panel is enhanced.

However, in the above display panel, the second light-transmitting layer 14 is a whole layer structure, which reduces the bendability of the display panel, and thus the bendability of the display panel is poor. In addition, the second light-transmitting layer 14 is formed by leveling and solidifying a fluid film layer that is formed by an inkjet printing (ink) process. A thickness of the light-transmitting layer formed by such a process is thick, and thus an overall thickness of the display panel is thick.

Some embodiments of the present disclosure provide a display panel, a method for manufacturing the same, and a display device, which solve some of the problems in some practices described above.

Figure 2:
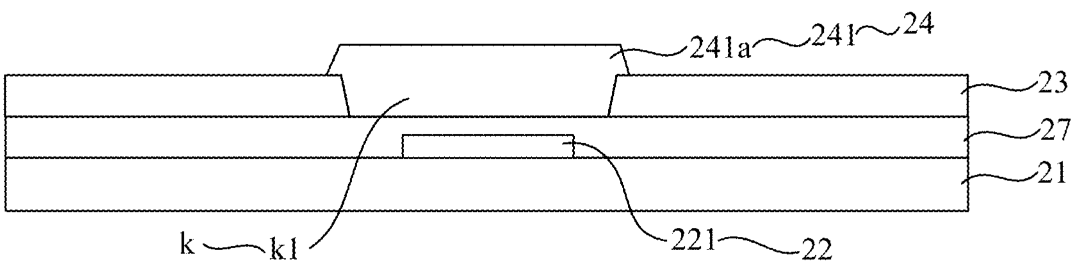
FIG. 2 is a schematic structural diagram of a display panel according to some embodiments of the present disclosure.

FIG. 2 is a schematic structural diagram of a display panel according to some embodiments of the present disclosure. The display panel includes:

- a base substrate 21;
- a plurality of light-emitting units 22 disposed on the base substrate 21;
- a first light-transmitting layer 23, disposed on the base substrate 21 provided with the plurality of light-emitting units 22; wherein the first light-transmitting layer 23 includes a plurality of holes k, and an orthographic projection of a first light-emitting unit 221 in the plurality of light-emitting units 22 on the base substrate 21 is overlapped with an orthographic projection of a first hole k1 in the plurality of holes k on the base substrate 21; and
- a light-transmitting pattern 24 disposed on the base substrate 21 provided with the first light-transmitting layer 23; wherein the light-transmitting pattern 24 includes a plurality of light-transmitting structures 241, a first light-transmitting structure 241*a* in the plurality of light-transmitting structures 241 covers the first hole k1 and at least a portion of the first light-transmitting layer 23, and a refractive index of a material of the light-transmitting pattern 24 is greater than a refractive index of a material of the first light-transmitting layer 23.

In summary, some embodiments of the present disclosure provide a display panel. The display panel includes the base substrate and the light-emitting units, the first light-transmitting layer, and the light-transmitting pattern that are provided on the base substrate. The hole in the first light-transmitting layer is opposite to the light-emitting unit. The light-transmitting pattern includes the light-transmitting structure, and the light-transmitting structure covers the hole in the first light-transmitting layer and covers a portion of the first light-transmitting layer. In this way, the light-transmitting structure and the hole in the first light-transmitting layer form a lens-like structure, which enhances the light-exit efficiency of the display panel. Because the light-transmitting pattern includes the plurality of light-transmitting structures instead of being a whole layer structure, the bendability of the display panel is not reduced, such that the problem of the poor bendability of the display panel in some practices is addressed, and the bendability of the display panel is enhanced.

In addition, the first light-transmitting layer of the whole layer structure in some practices is formed by leveling and solidifying the fluid film layer that is formed by the ink-jet printing process. The thickness of the first light-transmitting layer formed by such a process is thick, and thus the overall thickness of the display panel is thick. In the display panel according to some embodiments of the present disclosure, the patterned light-transmitting pattern includes the plurality of light-transmitting structures, and the light-transmitting pattern is formed by a patterning process without being formed by the ink-jet printing process and the leveling and solidification, such that a thickness of the light-transmitting pattern is reduced, and thus the overall thickness of the display panel is reduced.

In the display panel according to some embodiments of the present disclosure, the hole in the first light-transmitting layer and the light-transmitting structure above the hole form a structure similar to a double lens, which enhances the light-exit efficiency of the display panel together.

Further, the display panel further includes an intermediate layer 27 between the light-emitting unit 22 and the first light-transmitting layer 23. The intermediate layer 27 includes a plurality of film layer structures to achieve various functions such as protecting the light-emitting units 22. Exemplarily, the intermediate layer 27 includes structures such as a package layer, a touch layer, an insulation layer, and the like.

Figure 3:
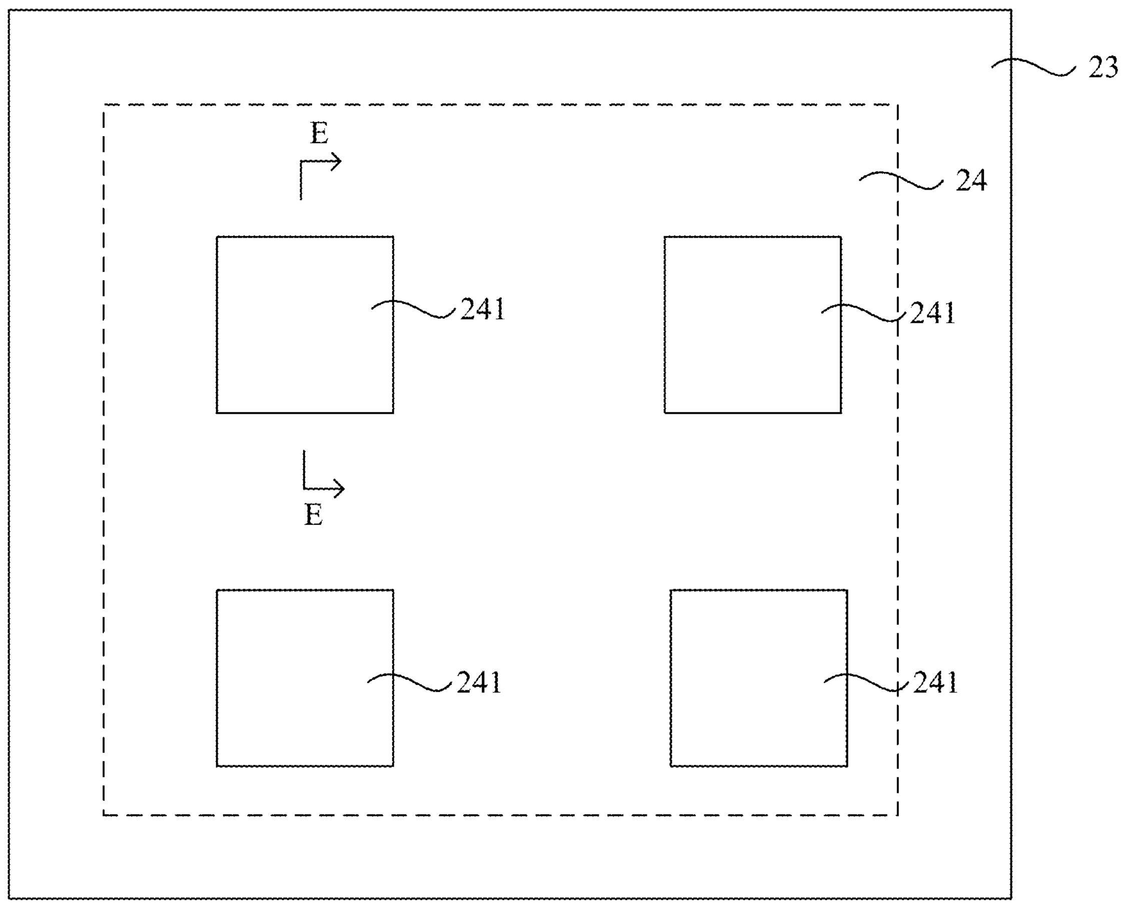
FIG. 3 is a top-view schematic structural diagram of the display panel illustrated in FIG. 2.
Figure 4:
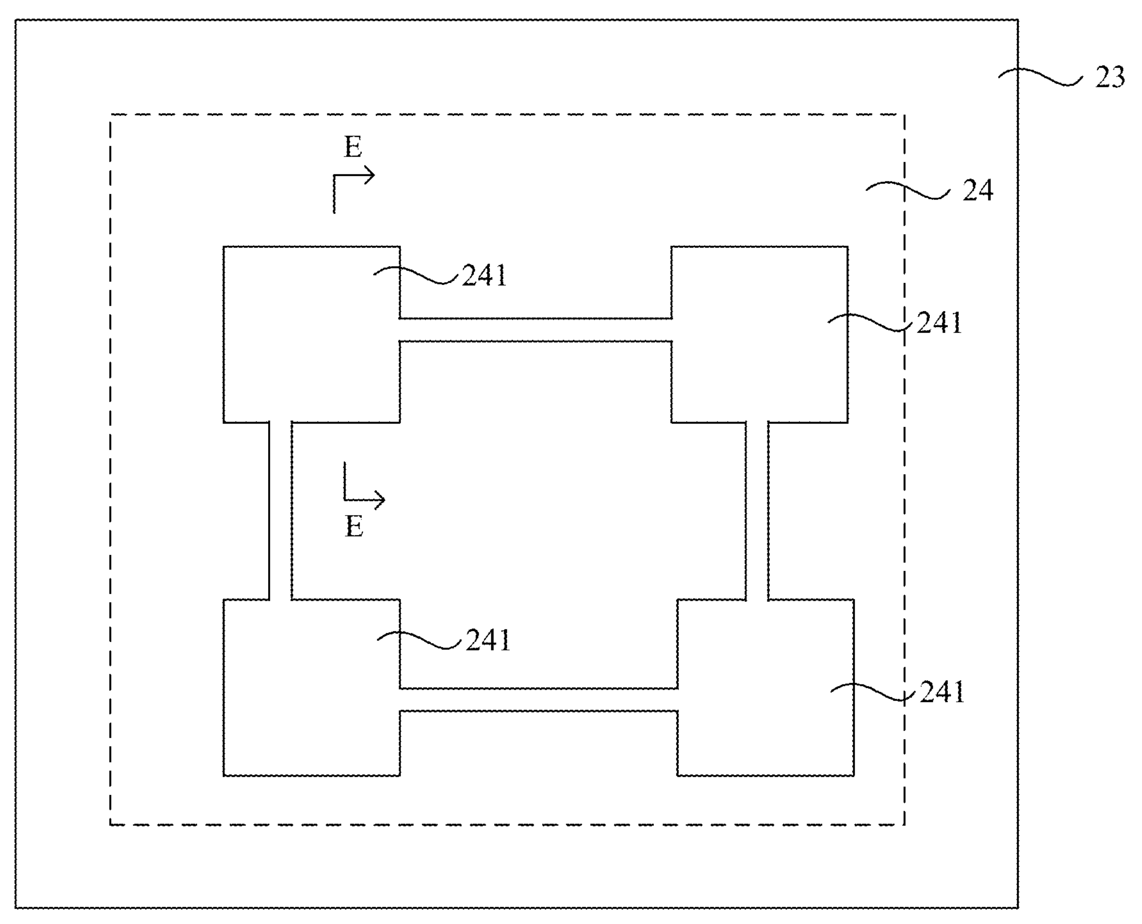
FIG. 4 is another top-view schematic structural diagram of the display panel illustrated in FIG. 2.

FIG. 3 is a top view schematic structural diagram of the display panel illustrated in FIG. 2 (FIG. 2 is a sectional diagram of the display panel illustrated in FIG. 3 at an E-E position). As illustrated in FIG. 3, the plurality of light-transmitting structures 241 in the light-transmitting pattern 24 are arranged on the display panel, and the first light-transmitting structure is one or more of the light-transmitting structures. Because the plurality of light-transmitting structures 241 are scattered on the display panel, the light-transmitting pattern 24 basically does not construe any limitation to the bending of the display panel, which enhances the bendability of the display panel. FIG. 4 is another top-view schematic structural diagram of the display panel illustrated in FIG. 2 (FIG. 2 is a sectional diagram of the display panel illustrated in FIG. 4 at the E-E position). In some embodiments, referring to FIG. 4, the plurality of light-transmitting structures 241 in the light-transmitting pattern 24 are arranged on the display panel, and the plurality of light-transmitting structures 241 are connected to each other. That is, the plurality of light-transmitting structures 241 are not independent structures. The first light-transmitting structure is one or more of the light-transmitting structures. Because the plurality of light-transmitting structures 241 are scattered on the display panel, the light-transmitting pattern 24 basically does not construe any limitation to the bending of the display panel, which enhances the bendability of the display panel.

Referring to FIG. 2, in the display panel, the light-emitting unit 22 emits light to each direction within 180 degrees of a side, on which the light-emitting unit 22 is provided, of the base substrate 21. However, viewers viewing the display panel are usually located in a region directly opposite to the display panel 20, and thus a portion of the light emitted by the light-emitting unit 22 is not directed to the region where the viewers are located, which leads to a waste of light. However, in the display panel according to some embodiments of the present disclosure, a lens-like structure is formed by the cooperation between the first hole 231 of the first light-transmitting layer 23 and the second first light-transmitting layer 14. A portion of the light emitted by the light-emitting unit 22 is irradiated to the first light-transmitting structure 241 within the first hole 231 and irradiated to a wall of the first hole 231. Because the refractive index of the material of the first light-transmitting structure 241*a* is greater than the refractive index of the material of the first light-transmitting layer 23, a portion of the light is totally reflected on the wall of the hole and directed to the region directly opposite to the display panel. In this way, the light-exit efficiency of the display panel is enhanced by the structure formed by the first light-transmitting structure 241*a* and the first hole 231.

In the display panel provided according to the above embodiments, the light-exit efficiency of the light beam emitted by the first light-emitting unit 221 is enhanced by the combination of the first light-emitting unit 221, the first hole k1, and the first light-transmitting structure 241*a*. In the above display panel, one or more light-emitting units in the plurality of light-emitting units are the first light-emitting units, one or more holes in the plurality of holes are the first holes, and one or more light-transmitting structures in the plurality of light-transmitting structures are the first light-transmitting units. In some embodiments, the display panel includes one or more light-emitting units, above which the first light-transmitting layer is not arranged with holes; or the display panel includes one or more light-emitting units, above which the first light-transmitting layer is arranged with holes but light-transmitting structures are not arranged within the holes, which is not limited herein.

In some embodiments, each of the plurality of light-emitting units is the first light-emitting unit, each of the plurality of holes is the first hole, and each of the plurality of light-transmitting structures is the first light-transmitting unit. In this way, the overall light-exit efficiency of the display panel is further enhanced.

In some embodiments, the light-emitting units 22 and the holes k in the first light-transmitting layer 23 are in one-to-one correspondence, and the holes k in the first light-transmitting layer 23 and the light-transmitting structures 241 are also in one-to-one correspondence, which is not limited herein.

The plurality of holes and the plurality of light-transmitting structures that are disposed on the first light-transmitting layer according to some embodiments of the present disclosure constitute a micro lens array (MLA) that enhances the light-exit efficiency of the display panel.

Figure 5:
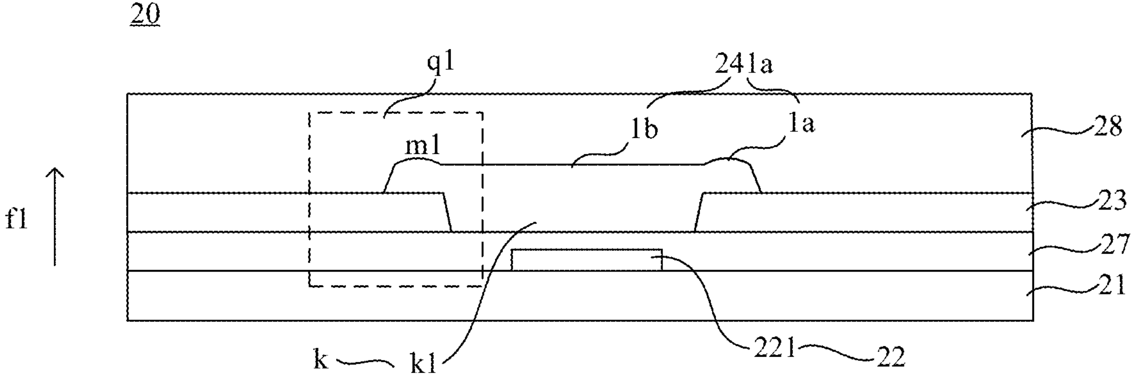
FIG. 5 is a schematic structural diagram of another display panel according to some embodiments of the present disclosure.

FIG. 5 is a schematic structural diagram of another display panel according to some embodiments of the present disclosure. Referring to FIG. 5, in the display panel, the first light-transmitting structure 241*a* includes a first portion 1*a* covering the first light-transmitting layer 23 and a second portion 1*b* within the first hole k1. A height, in a first direction f1 perpendicular to and away from the base substrate 21, of the first portion 1*a* is greater than a height, in the first direction f1, of the second portion 1*b*. That is, a height of a portion, covering the first light-transmitting layer 23, of the first light-transmitting structure 241*a* is greater than a height of a portion, not covering the first light-transmitting layer 23, of the first light-transmitting structure 241*a*. Such a height difference is formed by the first light-transmitting layer 23 jacking up the first light-transmitting structure 241*a* or is formed by a process treatment, which is not limited herein.

The portion, covering the first light-transmitting layer 23, of the first light-transmitting structure 241*a* is disposed at an edge of the first light-transmitting structure 241*a*. That is, the first light-transmitting structure 241*a* includes a protruding edge, which scatters the light beam, and thus a problem that the light-exit luminance of the display panel decays when the viewing angle increases (i.e., Luminance-decay, L-Decay) is improved.

It should be noted that the height, in the first direction f1 perpendicular to and away from the base substrate 21, of the first portion 1*a* being greater than the height, in the first direction f1, of the second portion 1*b* refers to a minimum height of the first portion 1*a* in the first direction f1 being greater than a maximum height of the second portion 1*b* in the first direction f1, a maximum height of the first portion 1*a* in the first direction f1 being greater than the maximum height of the second portion 1*b* in the first direction f1, or an average height of the first portion 1*a* in the first direction f1 being greater than an average height of the second portion 1*b* in the first direction f1, which is not limited herein.

In some embodiments, a top surface m1 of the first portion 1*a* of the first light-transmitting structure 241*a* includes a curved surface projecting toward a direction away from the base substrate 21. The projecting curved surface further enhances the ability of the first portion 1*a* to scatter light, which further improves the problem that the light-exit luminance of the display panel decays when the viewing angle increases. The curved surface is a structure formed by the first light-transmitting layer 23 jacking up the first light-transmitting structure 241*a* and the action of nature of the material of the light-transmitting structure, or formed by a process treatment, which is not limited herein.

Optionally, the display panel further includes a second light-transmitting layer 28 disposed above the light-transmitting pattern. The second light-transmitting layer 28 is made of a material of which a refractive index is smaller than that of the light-transmitting pattern. Exemplarily, the second light-transmitting layer 28 is made of an optical clear adhesive (OCA).

Figure 6:
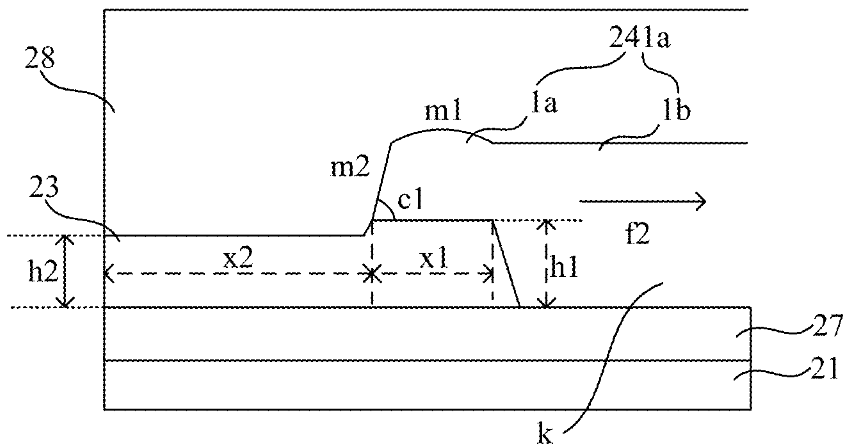
FIG. 6 is an enlarged schematic structural diagram of a partial region of the display panel illustrated in FIG. 5.

FIG. 6 is an enlarged schematic structural diagram of a partial region (a region q1) of the display panel illustrated in FIG. 5. In some embodiments, as illustrated in FIG. 6, a side surface m2 of the first portion 1*a* is a slope inclined toward a direction f2 facing a center of the hole k, and an inclination angle c1 of the side surface m2 of the first portion 1*a* is greater than or equal to 50 degrees. With this inclination structure, the side surface m2 is an interface of the first light-transmitting structure and a structure above the first light-transmitting structure. A refractive index of the structure above the first light-transmitting structure is smaller than that of the first light-transmitting structure, and thus the slope m2 is capable of adjusting a deflection direction of the light beam, which enhances the light-exit efficiency of the display panel. A surface being inclined toward a direction (which is referred to as a target direction) involved in the embodiments of the present disclosure indicates that a first side and a second side of the surface are arranged along the direction, wherein the first side and the second side are two sides, opposite to each other, of the surface, and the first side is disposed on a side, distal from the base substrate, of the second side.

Optionally, the inclination angle c1 of the side surface m2 of the first portion 1*a* ranges from 70 degrees to 80 degrees. In the case that the inclination angle c1 is within this range, the light-exit efficiency of the display panel is further enhanced.

Optionally, a wall m3 of the hole k of the first light-transmitting layer 23 is inclined toward a direction opposite to the direction f2, wherein the direction f2 is a direction facing toward the center of the hole k. That is, the hole is in a shape of a trumpet with a large top and a small bottom. The hole with such a structure facilitates adjustment of the direction of the light beam emitted by the light-emitting unit, such that the light-exit efficiency is enhanced. An inclination angle c2 of the wall m3 is greater than a total reflection critical angle of an interface of the light-transmitting pattern 24 and the first light-transmitting layer 23. That is, the inclination angle c2>arcsin (n1/n2), wherein n1 is the refractive index of the material of the first light-transmitting layer, and n2 is the refractive index of the material of the light-transmitting structure. The hole k is filled with the light-transmitting structure, and thus the wall of the hole k is an interface of the first light-transmitting layer and the light-transmitting structure. With this structure that the inclination angle c2 of the wall m3 is greater than the total reflection critical angle of the interface of the light-transmitting pattern 24 and the first light-transmitting layer 23, more light beams are totally reflected at the interface, and thus the light-exit efficiency of the display panel is enhanced.

In some embodiments, referring to FIG. 6, the first light-transmitting layer 23 includes a first region x1 covered by the first light-transmitting structure 241*a* and a second region x2 not covered by the first light-transmitting structure 241*a*. A thickness h1, within the first region x1, of the first light-transmitting layer 23 is greater than a thickness h2, within the second region x2, of the first light-transmitting layer 23.

Such a structure is formed by a pre-treatment (Descum) process performed upon forming the light-transmitting pattern 24. The light-transmitting pattern 24 is a pattern formed by a patterning process upon forming an entire light-transmitting film layer on the first light-transmitting layer 23. The above pretreatment process is used to remove the light-transmitting film layer that has not been removed cleanly.

Figure 7:
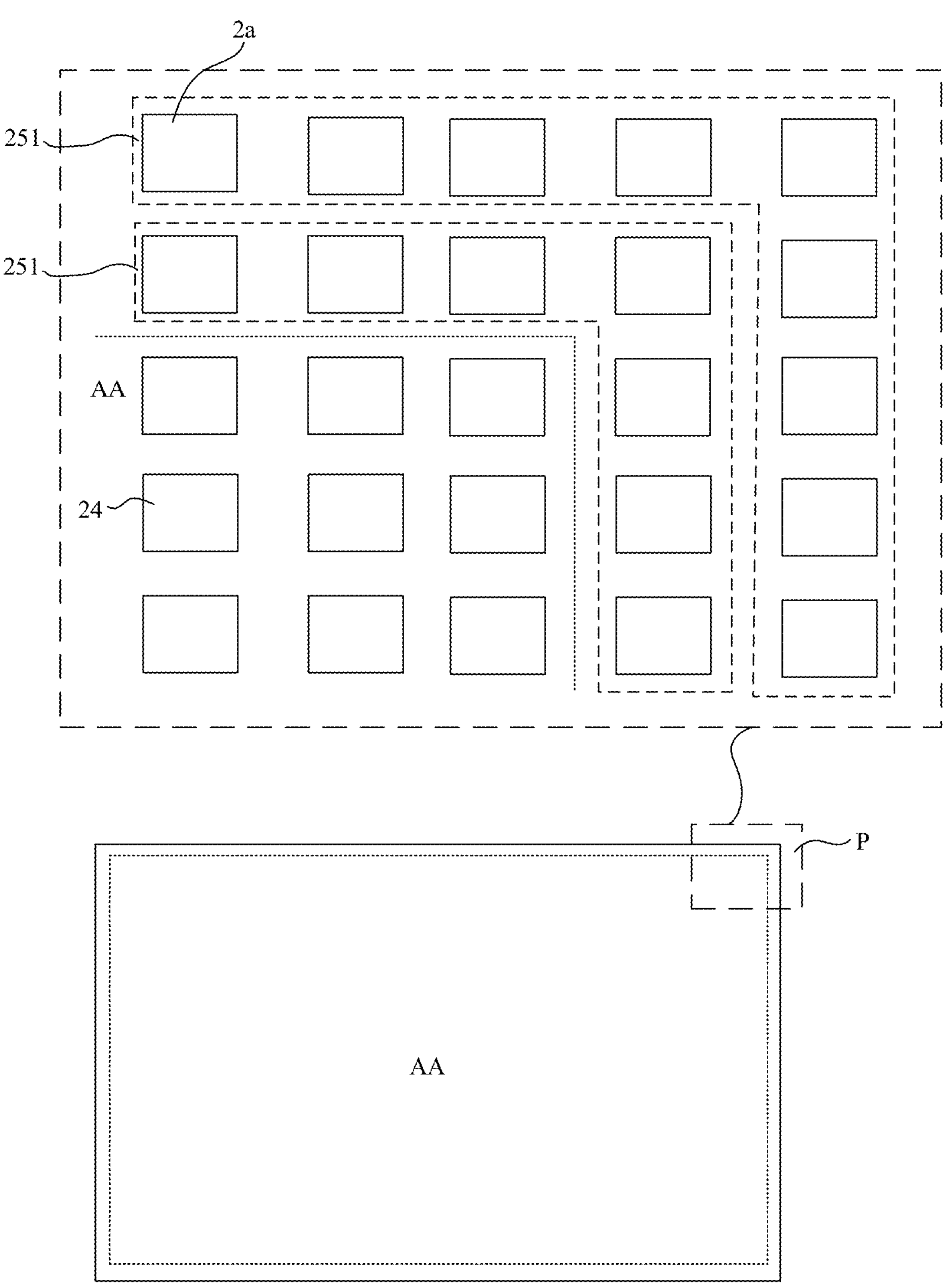
FIG. 7 is a top-view schematic structural diagram of a display panel according to some embodiments of the present disclosure.

FIG. 7 is a top-view schematic structural diagram of a display panel according to some embodiments of the present disclosure (the top view illustrates an enlarged schematic structural diagram of the display panel at a region P). Referring to FIG. 7, the display panel further includes a target pattern 25 disposed on the base substrate provided with the first light-transmitting layer 23. An orthographic projection of the target pattern 25 on the base substrate 21 surrounds outside an orthographic projection of the light-transmitting pattern 24 on the base substrate 21. The target pattern 25 is employed to balance a thickness difference between a region, provided with the light-transmitting pattern, in the display panel and an edge region, not provided with the light-transmitting pattern, in the display panel, such that the probability of various problems, such as a mura phenomenon (a phenomenon where the luminance of the display panel is not uniform and causes various traces), occurring to the light-transmitting pattern proximal to the edge is reduced.

In some embodiments, the target pattern 25 includes at least two types of structures. For one of the two structures, the target pattern 25 includes a plurality of block structures, and for the other structure, the target pattern 25 includes a strip-shaped structure.

For the embodiments that the target pattern includes the block structures, referring to FIG. 7, the display panel includes an effective display region AA, and the light-transmitting pattern 24 is within the effective display region AA. The target pattern 25 includes at least one block structure group 251, and each of the at least one block structure group 251 includes a plurality of block structures 2*a* outside the effective display region AA and arranged along an edge of the effective display region AA. That is, the block structure group 251 surrounds outside the effective display region AA. In some embodiments, the target pattern 25 includes at least two block structure groups 251, and the at least two block structure groups 251 are successively arranged along a direction away from a center of the display panel. That is, the plurality of block structure groups are arranged in a plurality of circles (which may not be closed circles) surrounding the effective display region AA, which enhances the effect of balancing the thickness difference, and thus the effect of the mura phenomenon is further reduced. The block structure 2*a* is referred to as a dummy pixel. Shapes of the block structure 2*a* and the light-transmitting structure in the effective display region AA are the same or different, which is not limited herein.

Figure 8:
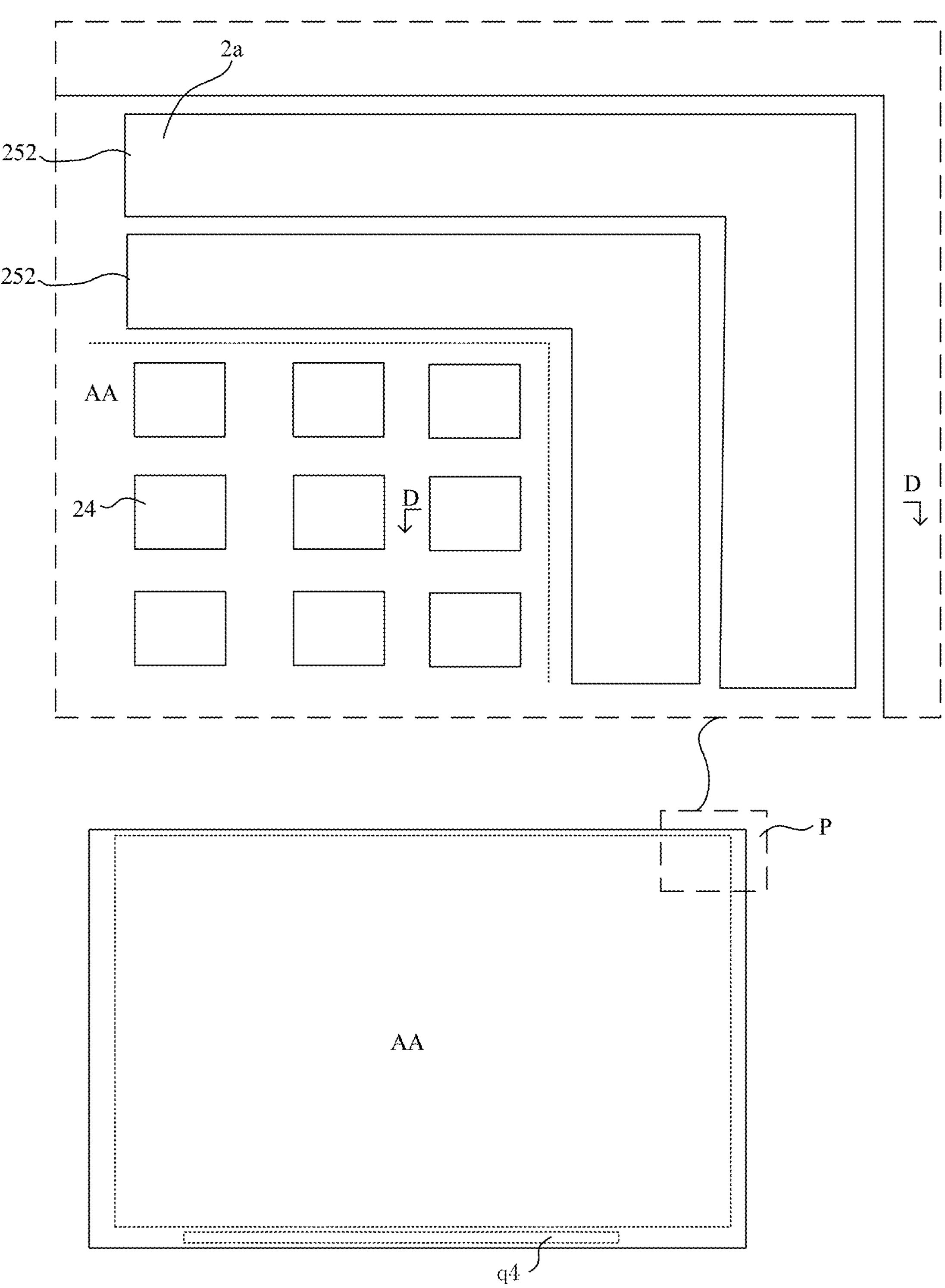
FIG. 8 is another top-view schematic structural diagram of a display panel according to some embodiments of the present disclosure.

FIG. 8 is another top view schematic structural diagram of a display panel according to some embodiments of the present disclosure (the top view illustrates an enlarged schematic structural diagram of the display panel at a region P). For the embodiments that the target pattern includes the strip-shaped structure, referring to FIG. 8, the display panel includes an effective display region AA, and the light-transmitting pattern 24 is within the effective display region AA. The target pattern 25 includes a strip-shaped structure 252 outside the effective display region AA and extending along an edge of the effective display region. The strip-shaped structure 252 implements a function similar to that of the block structure group described above. The strip-shaped structure is referred to as a dummy strip.

Optionally, a width of the strip-shaped structure 252 ranges from 50 microns to 500 microns. By providing the strip-shaped structure 252 of this width range, the effect of balancing the thickness difference is enhanced on the basis of facilitating manufacturing, and thus the effect of the mura phenomenon is further reduced. It should be noted that the width of the strip-shaped structure refers to a size of the strip-shaped structure in a direction perpendicular to an extension direction.

In some embodiments, the target pattern 25 includes at least two strip-shaped structures 252, and the at least two strip-shaped structures 252 are successively arranged outside the effective display region AA along a direction away from a center of the display panel. That is, the plurality of strip-shaped structures 252 are arranged in a plurality of circles (which may not be closed circles) surrounding the effective display region AA, which enhances the effect of balancing the thickness difference, and thus the effect of the mura phenomenon is further reduced.

The display panel further includes a wiring region q4 configured to connect wirings (such as a flexible printed circuit (FPC) and an integrated circuit (IC)). The target pattern 25 is not provided in the wiring region q4, which avoids an impact on the structure in the wiring region q4.

Figure 9:
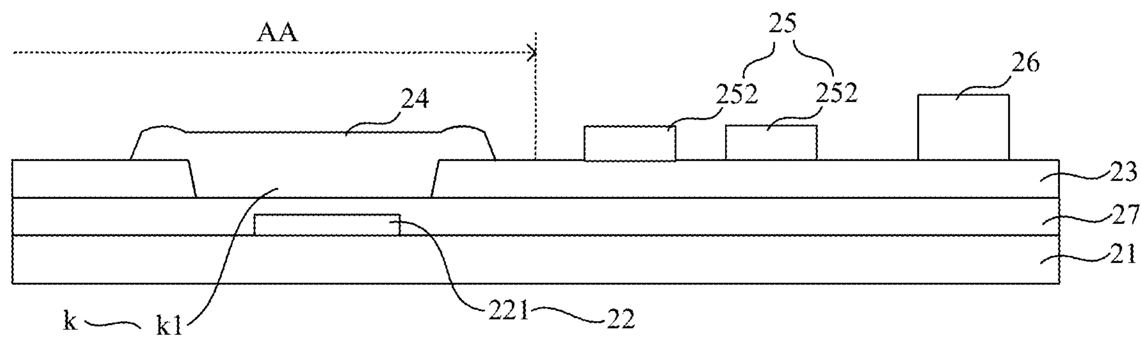
FIG. 9 is a sectional schematic structural diagram of the display panel illustrated in FIG. 8.

FIG. 9 is a sectional schematic structural diagram of the display panel illustrated in FIG. 8 (the sectional position is at a D-D position). In some embodiments, referring to FIG. 9, the target pattern 25 and the light-transmitting pattern 24 are disposed in the same layer. That is, the target pattern 25 is a patterned structure that is of the same material as the light-transmitting pattern 24 and is formed with light-transmitting pattern 24 in a one-time patterning process, such that the number of the patterning processes is saved.

In some embodiments, the light-transmitting pattern 24 is made of a negative photoresist material, and thus a process of forming the light-transmitting pattern 24 includes coating a photoresist material layer, and exposing and developing the photoresist material layer.

Figure 10:
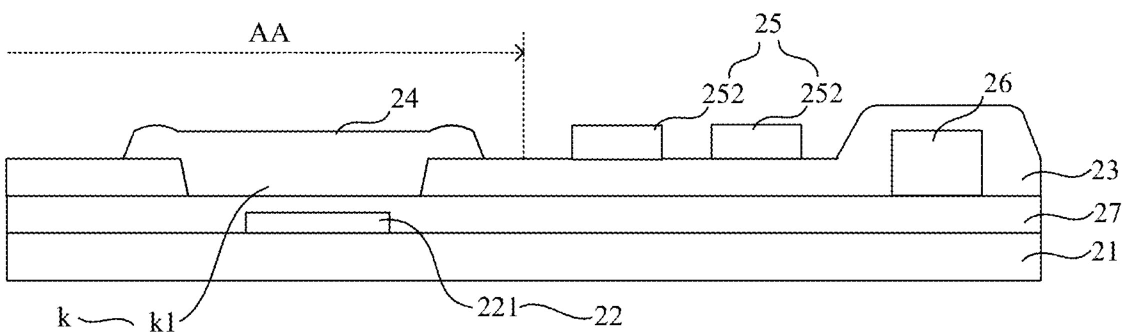
FIG. 10 is another sectional schematic structural diagram of the display panel illustrated in FIG. 8.

In some embodiments, referring to FIG. 9, the display panel further includes a barrier dam 26 disposed at an edge of the base substrate. The orthographic projection of the target pattern 25 on the base substrate 21 is disposed on a side, proximal to the center of the display panel, of an orthographic projection of the barrier dam 26 on the base substrate 21. Because a region outside the barrier dam has less influence on the display of the display panel, the target pattern 25 is arranged between the barrier dam 26 and the effective display region AA. A plurality of layers of barrier dams are provided. In some embodiments, the target pattern 25 is arranged between a barrier dam closest to the center of the display panel (i.e., an innermost barrier dam) and the effective display region AA. FIG. 9 illustrates a structure in which the barrier dam is disposed on the first light-transmitting layer 23, but the barrier dam is also disposed at other positions. FIG. 10 is another sectional schematic structural diagram of the display panel illustrated in FIG. 8 (the sectional position is at the D-D position). Exemplarily, referring to FIG. 10, the barrier dam 26 is between the first light-transmitting layer 23 and the intermediate layer 27 and jacks up the first light-transmitting layer 23.

Figure 17:
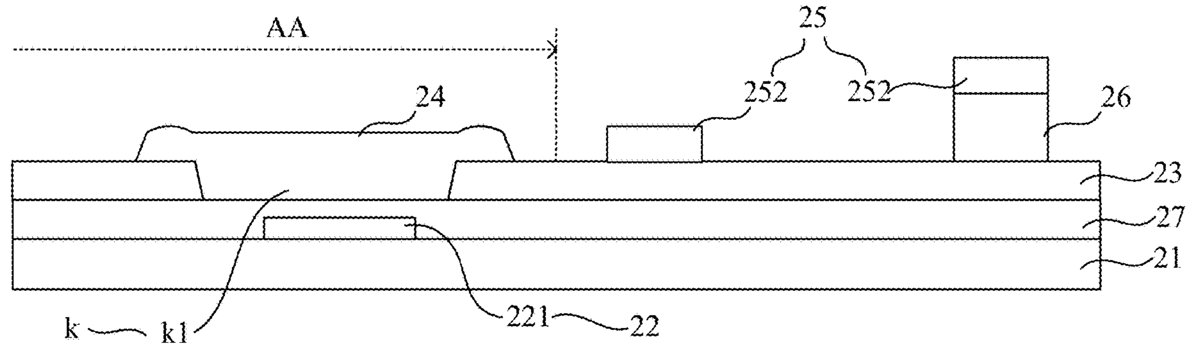
FIG. 17 is still another sectional schematic structural diagram of the display panel illustrated in FIG. 8.

In some embodiments, the target pattern covers the barrier dam as shown in FIG. 17, or the target pattern covers the barrier dam, and an inner edge of the target pattern is between the barrier dam and the effective display region, and an outer edge is disposed on a cut edge of the display panel, which are not limited herein.

Figure 11:
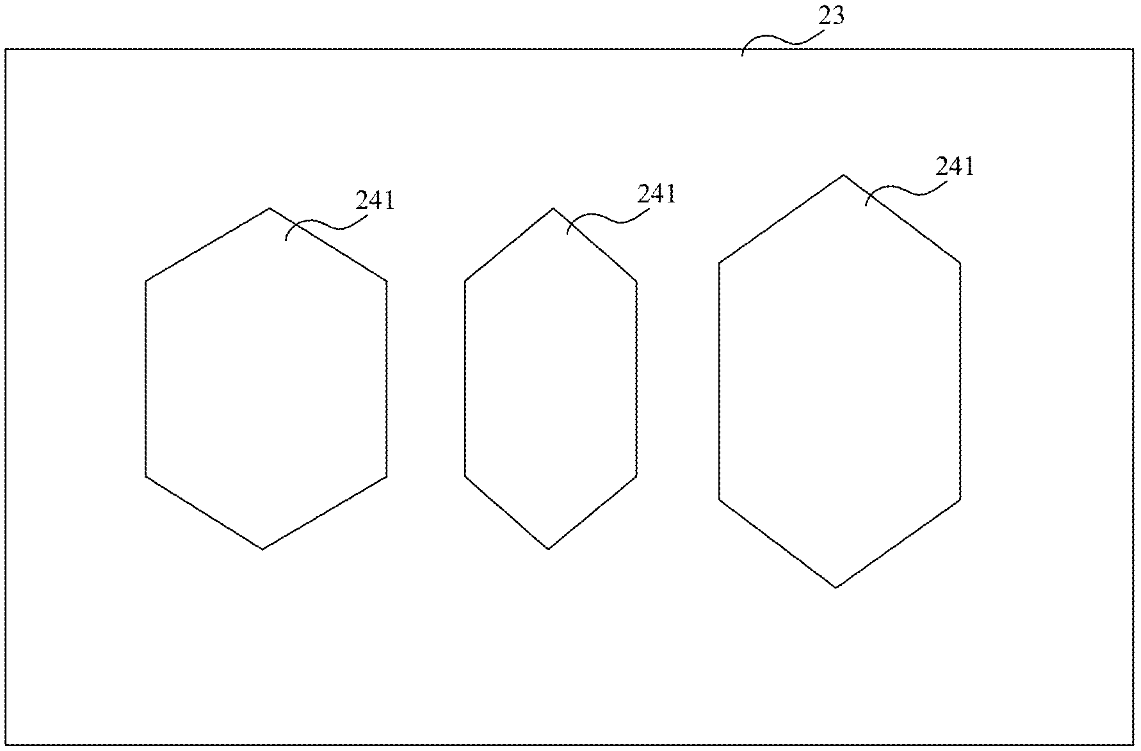
FIG. 11 is a schematic structural diagram of a pixel region in the display panel illustrated in FIG. 8.

FIG. 11 is a schematic structural diagram of a pixel region in the display panel illustrated in FIG. 8. Referring to FIG. 11, the pixel region includes three light-emitting units, which have different shapes. Three corresponding light-transmitting structures 241 of different shapes correspondingly cover these three light-emitting units.

Figure 12:
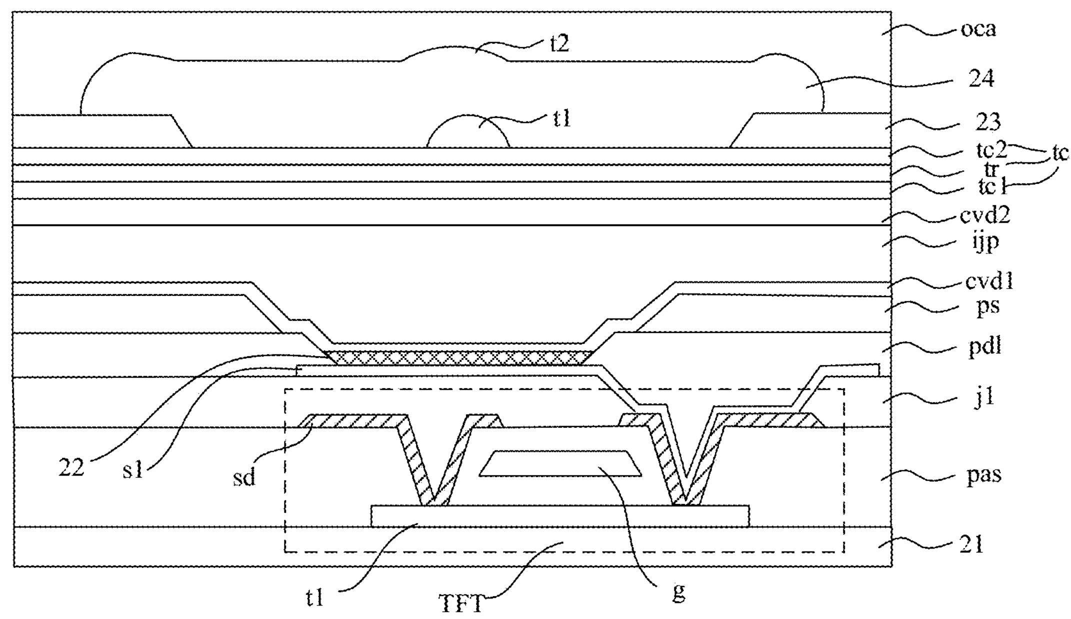
FIG. 12 is a schematic structural diagram of still another display panel according to some embodiments of the present disclosure.

FIG. 12 is a schematic structural diagram of still another display panel according to some embodiments of the present disclosure. Referring to FIG. 12, the display panel further includes a passivation layer pas, an insulation layer j1, a thin-film transistor tft, an anode s1, a pixel definition layer pdl, a support structure ps, a first chemical vapor deposition (CVD) layer CVD1, an ink-jet printing layer IJP, a second chemical vapor deposition layer CVD2, and an optical adhesive layer oca that are arranged on the base substrate 21. The thin-film transistor tft is electrically connected to the anode s1. The anode s1 is electrically connected to the light-emitting unit 22 (the light-emitting unit 22 herein is a structure including an electroluminescent layer). The optical adhesive layer oca covers the light-transmitting pattern, which facilitates the planarization. Other structures such, as a protection film layer, are arranged on the optical adhesive layer oca, which are not limited herein. The thin-film transistor tft includes structures such as a source layer t1, a source-drain layer sd, and a gate electrode g. In addition, the display panel further includes a touch layer tc, which is between the light-transmitting layer 23 and the second chemical vapor deposition layer CVD2 to implement a touch function. Exemplarily, the touch layer tc includes a first touch metal layer tc1, a second touch metal layer tc2, and an intermediate insulation layer tr between the first touch metal layer tc1 and the second touch metal layer tc2.

In addition, the display panel further includes a first protrusion structure t1 within the hole k of the first light-transmitting layer 23. The first protrusion structure t1 is configured to refract the light beam emitted by the light-emitting unit 22, which enhances the light-exit efficiency of the display panel. Furthermore, a portion, covering the first protrusion structure t1, of the first light-transmitting structure 241*a* is provided with a second protrusion structure t2. The second protrusion structure t2 is also configured to refract the light beam emitted by the light-emitting unit 22 to enhance the light-exit efficiency of the display panel.

Figure 13:
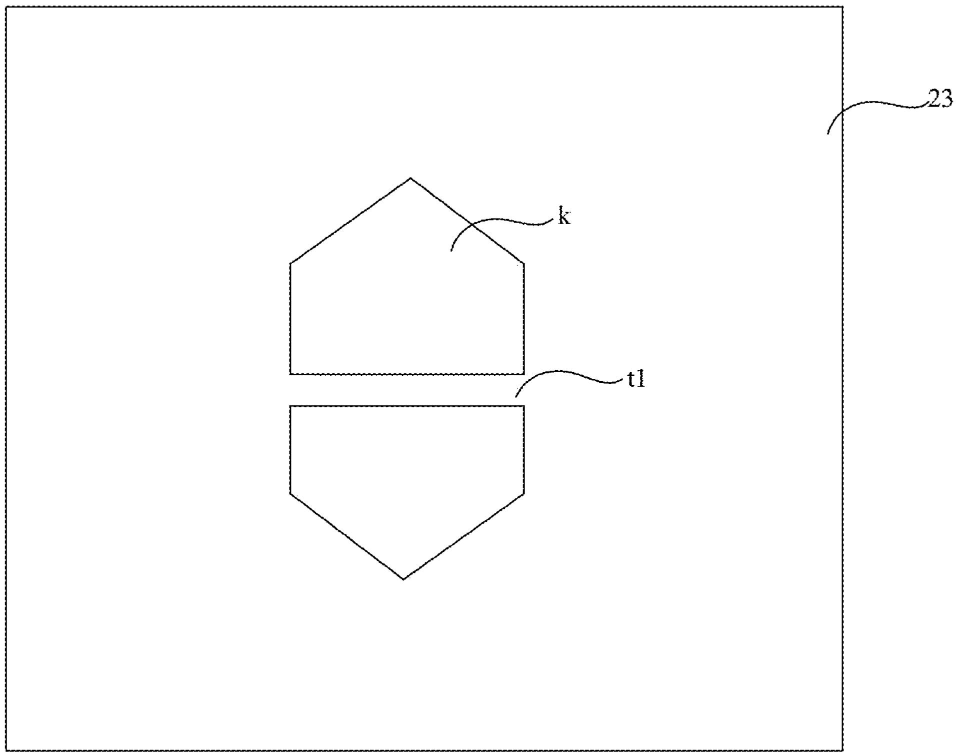
FIG. 13 is a top view of a first light-transmitting layer in the display panel illustrated in FIG. 12.

FIG. 13 is a top view of the first light-transmitting layer 23 in the display panel illustrated in FIG. 12. In some embodiments, referring to FIG. 13, the first protrusion structure t1 is a strip-shaped structure across the hole k. That is, two ends of the strip-shaped structure are respectively connected to two opposite walls of the hole k. FIG. 13 illustrates a scenario where the first protrusion structure t1 and the first light-transmitting layer 23 are disposed in the same layer, which is not limited herein. For example, the protrusion structure is a structure disposed in the center of the hole k and in the shape of a circle, a rectangle, or a diamond, and this structure and the first light-transmitting layer 23 are disposed in the same layer or different layers, which are not limited herein.

The display panel according to the above embodiments is a display panel with an enhanced efficiency structure (EES) technology applied.

Figure 14:
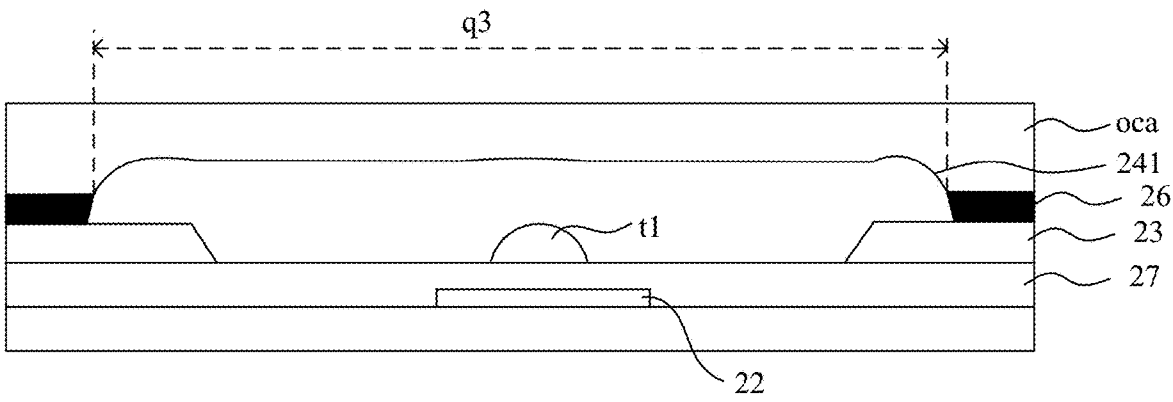
FIG. 14 is a schematic structural diagram of still another display panel according to some embodiments of the present disclosure.

FIG. 14 is a schematic structural diagram of still another display panel according to some embodiments of the present disclosure. Referring to FIG. 14, the light-transmitting structure 241 is a color film layer.

The display panel further includes a black matrix (BM) pattern 26 disposed on the base substrate 21 provided with the light-transmitting pattern 24. The black matrix pattern 26 includes a cutout region q3, and an orthographic projection of the light-emitting unit 22 on the base substrate is within an orthographic projection of the cutout region q3 on the base substrate 21.

Figure 15:
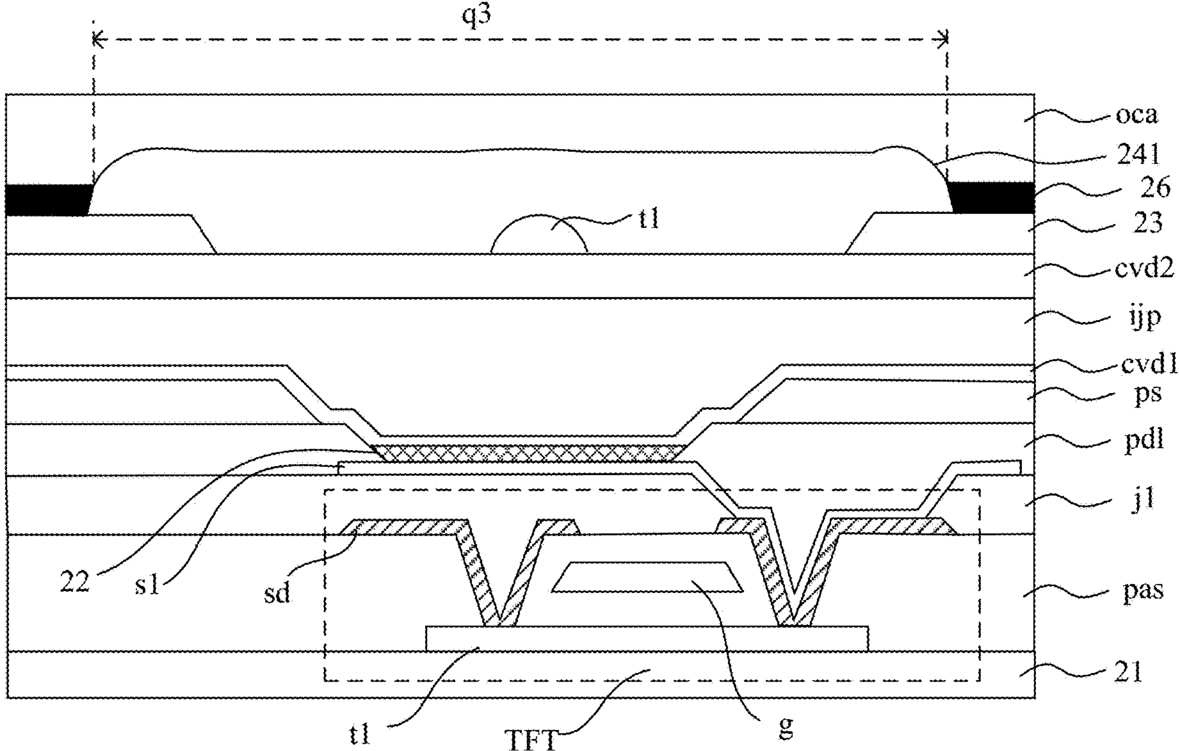
FIG. 15 is a schematic structural diagram of still another display panel according to some embodiments of the present disclosure.

FIG. 15 is a schematic structural diagram of still another display panel according to some embodiments of the present disclosure. Referring to FIG. 15, the display panel further includes an insulation layer pas, a thin-film transistor tft, an anode s1, a pixel definition layer pdl, a support structure ps, a first chemical vapor deposition (CVD) layer CVD1, an ink-jet printing layer IJP, a second chemical vapor deposition layer CVD2, and an optical adhesive layer oca that are arranged on the base substrate 21. The thin-film transistor tft is electrically connected to the anode s1, and the anode s1 is electrically connected to the light-emitting unit 22 (the light-emitting unit 22 herein is a structure including an electroluminescent layer). The optical adhesive layer oca covers the light-transmitting pattern, which facilitates the planarization. Other structures, such as a protection film layer, are provided on the optical adhesive layer oca, which are not limited herein. The thin-film transistor tft includes structures such as a source layer t1, a source-drain layer sd, and a gate electrode g.

In addition, the display panel further includes a protrusion structure tq within the hole k of the first light-transmitting layer 23. The protrusion structure tq is configured to refract the light beam emitted by the light-emitting unit 22, which enhances the light-exit efficiency of the display panel. The protrusion structure tq is a strip-shaped structure across the hole k. That is, two ends of the strip-shaped protrusion structure tq are respectively connected to two opposite walls of the hole k. Alternatively, the protrusion structure is a structure disposed in the center of the hole k, and is in the shape of a circle, a rectangle, or a diamond, which are not limited herein.

FIG. 15 illustrates a top black matrix type display panel. In some embodiments, the display panel according to some embodiments of the present disclosure is a bottom black matrix type display panel. In the bottom black matrix type display panel, the black matrix pattern is disposed on a side, proximal to the light-emitting unit, of the first light-transmitting layer.

The display panel illustrated in FIG. 15 is a display panel with a technique of forming a color film layer on a thin film encapsulated organic electroluminescent device (CF on EL, COE) applied.

A variety of structures of positions where the light-emitting units are disposed are provided in the above embodiments. The display panel according to some embodiments of the present disclosure includes a plurality of light-emitting units, and structures of positions where these light-emitting units are disposed include at least one of the structures described above.

In summary, some embodiments of the present disclosure provide a display panel. The display panel includes the base substrate and the light-emitting units, the first light-transmitting layer, and the light-transmitting pattern that are provided on the base substrate. The hole in the first light-transmitting layer is opposite to the light-emitting unit. The light-transmitting pattern includes the light-transmitting structure, and the light-transmitting structure covers the hole in the first light-transmitting layer and covers a portion of the first light-transmitting layer. In this way, the light-transmitting structure and the hole in the first light-transmitting layer form a lens-like structure, which enhances the light-exit efficiency of the display panel. Because the light-transmitting pattern includes the plurality of light-transmitting structures instead of being a whole layer structure, the bendability of the display panel is not reduced, such that the problem of the poor bendability of the display panel in some practices is addressed, and the bendability of the display panel is enhanced.

Figure 16:
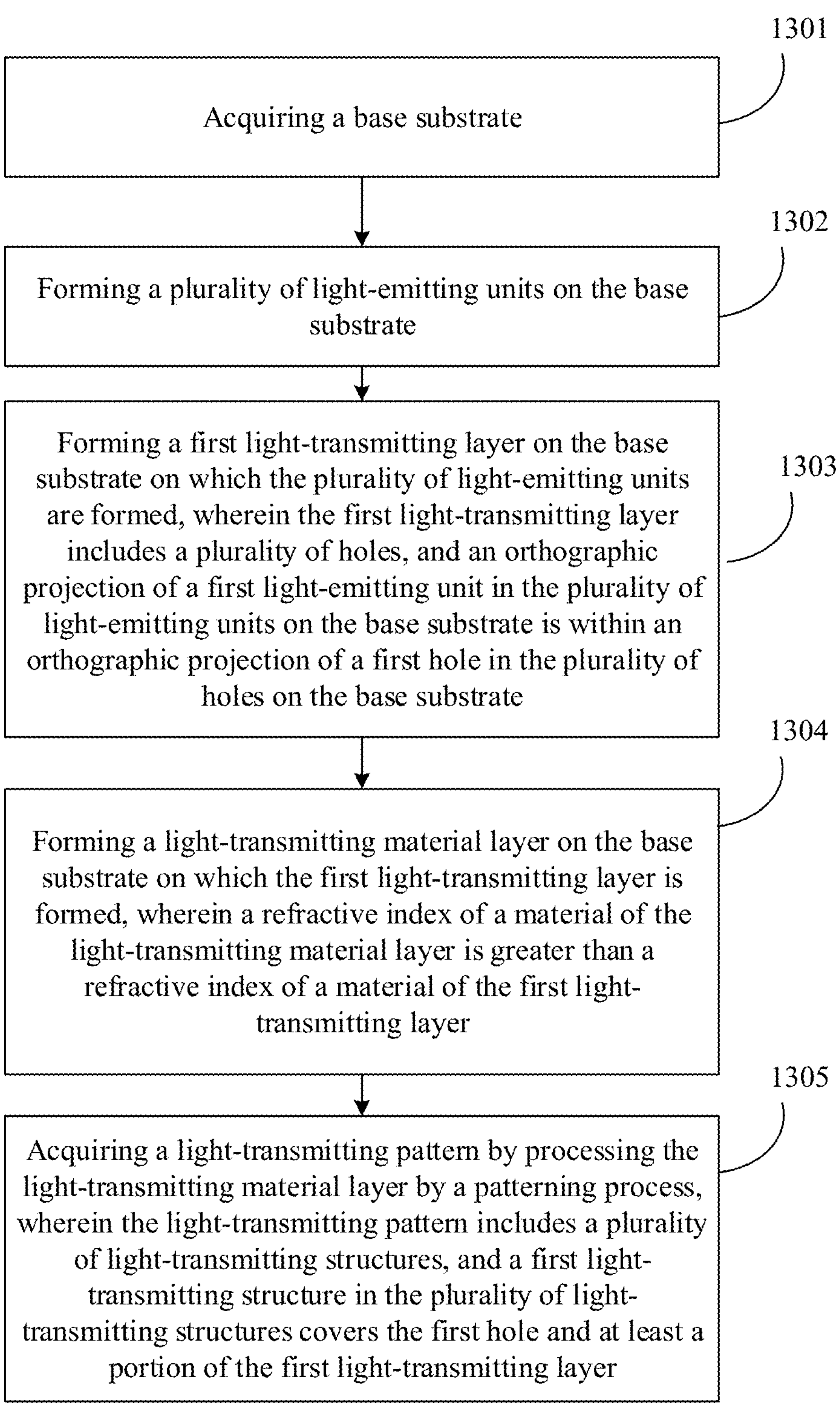
FIG. 16 is a method flowchart of a method for manufacturing a display panel according to some embodiments of the present disclosure.

FIG. 16 is a method flowchart of a method for manufacturing a display panel according to some embodiments of the present disclosure. The method is employed to manufacture any of the display panels according to the above embodiments, and the method includes the following steps.

In step 1301, a base substrate is acquired.

In step 1302, a plurality of light-emitting units are formed on the base substrate.

In step 1303, a first light-transmitting layer is formed on the base substrate on which the plurality of light-emitting units are formed, wherein the first light-transmitting layer includes a plurality of holes, and an orthographic projection of a first light-emitting unit in the plurality of light-emitting units on the base substrate is within an orthographic projection of a first hole in the plurality of holes on the base substrate.

In step 1304, a light-transmitting material layer is formed on the base substrate on which the first light-transmitting layer is formed, wherein a refractive index of a material of the light-transmitting material layer is greater than a refractive index of a material of the first light-transmitting layer.

The light-transmitting material layer is formed on the base substrate on which the first light-transmitting layer is formed by a coating process. Compared with an ink-jet printing process, the coating process achieves an effect of reducing a thickness of the light-transmitting material layer.

In step 1305, a light-transmitting pattern is acquired by processing the light-transmitting material layer by a patterning process, wherein the light-transmitting pattern includes a plurality of light-transmitting structures, and a first light-transmitting structure in the plurality of light-transmitting structures covers the first hole and at least a portion of the first light-transmitting layer.

The light-transmitting material layer is made of a photoresist material, and a process of acquiring the light-transmitting pattern by processing the light-transmitting material layer by the patterning process includes exposing and developing the light-transmitting material layer.

Upon acquiring the light-transmitting pattern, the display panel is pretreated to remove the light-transmitting material layer remaining on the display panel. During the pretreatment, due to the etching resistance of the first light-transmitting layer, a thickness of a portion, not covered by the light-transmitting pattern, of the first light-transmitting layer is less than a thickness of a portion, covered by the light-transmitting pattern, of the first light-transmitting layer, which forms a structure as illustrated in FIG. 6.

In summary, some embodiments of the present disclosure provide a method for manufacturing a display panel. The display panel includes the base substrate and the light-emitting units, the first light-transmitting layer, and the light-transmitting pattern that are provided on the base substrate. The hole in the first light-transmitting layer is opposite to the light-emitting unit. The light-transmitting pattern includes the light-transmitting structure, and the light-transmitting structure covers the hole in the first light-transmitting layer and covers a portion of the first light-transmitting layer. In this way, the light-transmitting structure and the hole in the first light-transmitting layer form a lens-like structure, which enhances the light-exit efficiency of the display panel. Because the light-transmitting pattern includes the plurality of light-transmitting structures instead of being a whole layer structure, the bendability of the display panel is not reduced, such that the problem of the poor bendability of the display panel in some practices is addressed, and the bendability of the display panel is enhanced.

In addition, the first light-transmitting layer of the whole layer structure in some practices is formed by leveling and solidifying a fluid film layer that is formed by the ink-jet printing process. A thickness of the first light-transmitting layer formed by such a process is thick, and thus an overall thickness of the display panel is thicker. However, in the display panel according to some embodiments of the present disclosure, the patterned light-transmitting pattern includes the plurality of light-transmitting structures, and the light-transmitting pattern is formed by the patterning process without being formed by the ink-jet printing process and the leveling and solidification, such that a thickness of the light-transmitting pattern is reduced, and thus the overall thickness of the display panel is reduced.

In addition, some embodiments of the present disclosure further provide a display device. The display device includes any of the display panels according to the above embodiments. The display device includes a smartphone, a tablet computer, a desktop computer, a laptop-type computer, a game console, a smart wearable device, a television set, an advertising machine, and various other devices having a display function. Because the display device is provided with the display panel provided by the above embodiments, the display device also has the beneficial effects of the above display panel. For the beneficial effects of the display device, reference is made to the above embodiments, which are not repeated herein.

The term "at least one of A and B" in the present disclosure is only a description of the contextual relationship between the contextual objects, indicating that three relationships may exist. For example, at least one of A and B may mean that A exists alone, A and B exist at the same time, and B exists alone. Similarly, "at least one of A, B and C" means that there are seven relationships, including A exists alone, B exists alone, C exists alone, A and B exist at the same time, A and C exist at the same time, C and B exist at the same time, and A, B, and C exist at the same time. Similarly, "at least one of A, B, C and D" means that there are fifteen relationships, including A exists alone, B exists alone, C exists alone, D exists alone, A and B exist at the same time, A and C exist at the same time, A and D exist at the same time, C and B exist at the same time, D and B exist at the same time, C and D exist at the same time, A, B, and C exist at the same time, A, B, and D exist at the same time, A, C, and D exist at the same time, B, C, and D exist at the same time, A, B, C, and D exist at the same time.

It should be pointed out that in the accompanying drawings, the sizes of layers and regions may be exaggerated for clearer illustration. It should be understood that in the case that an element or layer is referred to as being "on" another element or layer, it may be directly on another element, or intervening layers may be present. In addition, it should be understood that in the case that an element or layer is referred to as being "under" another element or layer, the layer may be directly under the other element, or there may be more than one intervening layer or element. In addition, it can further be understood that in the case that a layer or element is referred to as being "between" two layers or two elements, the layer may be the only layer between the two layers or two elements, or more than one intervening layer or element may also be present. Similar reference numerals indicate similar elements throughout.

In the present disclosure, the terms "first" and "second" are only used for descriptive purposes, and cannot be understood as indicating or implying relative importance. The term "a plurality of" refers to two or more, unless expressly defined otherwise.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display panel, comprising: a base substrate; a plurality of light-emitting units disposed on the base substrate; a first light-transmitting layer disposed on the base substrate provided with the plurality of light-emitting units, wherein the first light-transmitting layer comprises a plurality of holes, and an orthographic projection of a first light-emitting unit in the plurality of light-emitting units on the base substrate is overlapped with an orthographic projection of a first hole in the plurality of holes on the base substrate; and a light-transmitting pattern disposed on the base substrate provided with the first light-transmitting layer, wherein the light-transmitting pattern comprises a plurality of light-transmitting structures, a first light-transmitting structure in the plurality of light-transmitting structures covers the first hole and at least a portion of the first light-transmitting layer, and a refractive index of a material of the light-transmitting pattern is greater than a refractive index of a material of the first light-transmitting layer; wherein the display panel further comprises: an effective display region and a peripheral region outside the effective display region; wherein the light-transmitting pattern is within the effective display region; and the display panel further comprises a target pattern disposed on the base substrate provided with the light-emitting units, wherein the target pattern is within the peripheral region, and a refractive index of a material of the target pattern is greater than the refractive index of the material of the first light-transmitting layer; wherein the target pattern comprises at least one block structure group, each of the at least one block structure group comprising a plurality of block structures outside the effective display region and arranged along an edge of the effective display region; and the length and width of each of the plurality of block structures is identical to the length and width of each of the plurality of light-transmitting structures.

2. The display panel according to claim 1, wherein the first light-transmitting structure comprises a first portion covering the first light-transmitting layer and a second portion within the first hole, a height, in a first direction perpendicular to and away from the base substrate, of the first portion being greater than a height, in the first direction, of the second portion.

3. The display panel according to claim 1, wherein a wall of the first hole in the first light-transmitting layer is inclined toward a direction away from a center of the first hole, and an inclination angle of the wall is greater than a total reflection critical angle of an interface of the light-transmitting pattern and the first light-transmitting layer.

4. The display panel according to claim 1, wherein the target pattern and the light-transmitting pattern are disposed in a same layer.

5. The display panel according to claim 1, wherein the target pattern comprises at least two block structure groups, the at least two block structure groups being successively arranged along a direction away from a center of the display panel.

6. The display panel according to claim 1, wherein the target pattern comprises a strip-shaped structure, the strip-shaped structure being outside the effective display region and extending along an edge of the effective display region.

7. The display panel according to claim 1, further comprising: a first protrusion structure; wherein the first protrusion structure is within the hole in the first light-transmitting layer; and a portion, covering the first protrusion structure, of the first light-transmitting structure comprises a second protrusion structure.

8. The display panel according to claim 1, further comprising: a barrier dam disposed at an edge of the base substrate, wherein an orthographic projection of the target pattern on the base substrate is disposed on a side, proximal to a center of the display panel, of an orthographic projection of the barrier dam on the base substrate.

9. The display panel according to claim 1, further comprising: a barrier dam disposed at an edge of the base substrate, wherein the target pattern covers the barrier dam.

10. The display panel according to claim 1, wherein the light-transmitting structure is a color film layer; and the display panel further comprises a black matrix pattern disposed on the base substrate provided with the light-transmitting pattern, wherein the black matrix pattern comprises a cutout region, and an orthographic projection of the first hole in the first light-transmitting layer on the base substrate is within an orthographic projection of the cutout region on the base substrate.

11. The display panel according to claim 1, wherein the first light-transmitting layer comprises a first region covered by the first light-transmitting structure and a second region not covered by the first light-transmitting structure, a thickness of a portion, within the first region, of the first light-transmitting layer being greater than a thickness of a portion, within the second region, of the first light-transmitting layer.

12. A method for manufacturing a display panel, applicable to manufacturing the display panel as defined in claim 1, the method comprising: acquiring a base substrate; forming a plurality of light-emitting units on the base substrate; forming a first light-transmitting layer on the base substrate on which the plurality of light-emitting units are formed, wherein the first light-transmitting layer comprises a plurality of holes, an orthographic projection of a first light-emitting unit in the plurality of light-emitting units on the base substrate is overlapped with an orthographic projection of a first hole in the plurality of holes on the base substrate; forming a light-transmitting material layer on the base substrate on which the first light-transmitting layer is formed, wherein a refractive index of a material of the light-transmitting material layer is greater than a refractive index of a material of the first light-transmitting layer; and acquiring a light-transmitting pattern by processing the light-transmitting material layer by a patterning process, wherein the light-transmitting pattern comprises a plurality of light-transmitting structures, a first light-transmitting structure in the plurality of light-transmitting structures covering the first hole and at least a portion of the first light-transmitting layer; wherein the display panel further comprises: an effective display region and a peripheral region outside the effective display region; wherein the light-transmitting pattern is within the effective display region; and the display panel further comprises a target pattern disposed on the base substrate provided with the light-emitting units, wherein the target pattern is within the peripheral region, and the refractive index of a material of the target pattern is greater than the refractive index of the material of the first-light transmitting layer; wherein the target pattern comprises at least one block structure group, each of the at least one block structure group comprising a plurality of block structures outside the effective display region and arranged along an edge of the effective display region; and the length and width of each of the plurality of block structures is identical to the length and width of each of the plurality of light-transmitting structures.

13. The display panel according to claim 2, wherein a top surface of the first portion of the first light-transmitting structure comprises a curved surface projecting toward a direction away from the base substrate.

14. The display panel according to claim 2, wherein a side surface of the first portion is a slope inclined toward a direction facing a center of the first hole, and an inclination angle of the side surface of the first portion is greater than or equal to 50 degrees.

15. The display panel according to claim 6, wherein the target pattern comprises at least two strip-shaped structures, the at least two strip-shaped structures being outside the effective display region and successively arranged along a direction away from a center of the display panel.

16. The display panel according to claim 14, wherein the inclination angle of the side surface of the first portion ranges from 70 degrees to 80 degrees.

17. A display device, comprising: a display panel; wherein the display panel comprises: a base substrate; a plurality of light-emitting units disposed on the base substrate; a first light-transmitting layer disposed on the base substrate provided with the plurality of light-emitting units, wherein the first light-transmitting layer comprises a plurality of holes, and an orthographic projection of a first light-emitting unit in the plurality of light-emitting units on the base substrate is overlapped with an orthographic projection of a first hole in the plurality of holes on the base substrate; and a light-transmitting pattern disposed on the base substrate provided with the first light-transmitting layer, wherein the light-transmitting pattern comprises a plurality of light-transmitting structures, a first light-transmitting structure in the plurality of light-transmitting structures covers the first hole and at least a portion of the first light-transmitting layer, and a refractive index of a material of the light-transmitting pattern is greater than a refractive index of a material of the first light-transmitting layer; wherein the display panel further comprises: an effective display region and a peripheral region outside the effective display region; wherein the light-transmitting pattern is within the effective display region; and the display panel further comprises a target pattern disposed on the base substrate provided with the light-emitting units, wherein the target pattern is within the peripheral region, and a refractive index of a material of the target pattern is greater than the refractive index of the material of the first-light transmitting layer; wherein the target pattern comprises at least one block structure group, each of the at least one block structure group comprising a plurality of block structures outside the effective display region and arranged along an edge of the effective display region; and the length and width of each of the plurality of block structures is identical to the length and width of each of the plurality of light-transmitting structures.

* * * * *